United States Patent
Vukovic

(10) Patent No.: US 10,522,384 B2
(45) Date of Patent: Dec. 31, 2019

(54) ELECTROMAGNETIC WAVE TREATMENT OF A SUBSTRATE AT MICROWAVE FREQUENCIES USING A WAVE RESONATOR

(71) Applicant: Tokyo Electron Limited, Minato-ku, Tokyo (JP)

(72) Inventor: Mirko Vukovic, Slingerlands, NY (US)

(73) Assignee: Tokyo Electron Limited, Tokyo (JP)

( * ) Notice: Subject to any disclaimer, the term of this patent is extended or adjusted under 35 U.S.C. 154(b) by 494 days.

(21) Appl. No.: 15/250,110

(22) Filed: Aug. 29, 2016

(65) Prior Publication Data

US 2017/0084462 A1    Mar. 23, 2017

Related U.S. Application Data

(60) Provisional application No. 62/222,292, filed on Sep. 23, 2015.

(51) Int. Cl.
     *H01L 21/687*      (2006.01)
     *H01P 1/38*      (2006.01)
     (Continued)

(52) U.S. Cl.
     CPC ...... *H01L 21/68714* (2013.01); *H01L 21/324* (2013.01); *H01L 21/67115* (2013.01); *H01P 1/182* (2013.01); *H01P 1/38* (2013.01); *H01P 3/12* (2013.01); *H01P 7/06* (2013.01); *H01Q 13/22* (2013.01); *H01Q 21/0043* (2013.01)

(58) Field of Classification Search
None
See application file for complete search history.

(56) References Cited

U.S. PATENT DOCUMENTS

| | | | | |
|---|---|---|---|---|
| 3,710,063 A | * | 1/1973 | Aine | H05B 6/70 219/693 |
| 4,072,902 A | * | 2/1978 | Knox | H01P 1/16 455/318 |

(Continued)

OTHER PUBLICATIONS

E. Atanassova et al., "High-k HfTaO stacks in response to microwave irradiation," Journal ofPhysics:ConferenceSeries 253 (2010) 012038, 16 ISCMP:ProgressinSolidStateandMolecularElectronics, IonicsandPhotonics.

*Primary Examiner* — Ibrahime A Abraham
*Assistant Examiner* — Elizabeth M Sims
(74) *Attorney, Agent, or Firm* — Wood Herron & Evans LLP

(57) ABSTRACT

A processing system is disclosed, having a process chamber that houses a substrate for exposure of a surface of the substrate to a travelling electromagnetic (EM) wave. The processing system also includes an EM wave transmission antenna configured to launch the travelling EM wave into the process chamber for the travelling EM wave to propagate in a direction substantially parallel to the surface of the substrate. The processing system also includes a power coupling system configured to supply EM energy into the EM wave transmission antenna to generate the travelling EM wave at a prescribed output power and in a prescribed EM wave mode during treatment of the substrate. The EM wave is recycled in the processing system in order to increase the efficiency of the microwave power use and eliminate the complexity of the resistive load cooling.

14 Claims, 9 Drawing Sheets

(51) Int. Cl.
  *H01P 1/18* (2006.01)
  *H01P 3/12* (2006.01)
  *H01P 7/06* (2006.01)
  *H01L 21/324* (2006.01)
  *H01Q 13/22* (2006.01)
  *H01Q 21/00* (2006.01)
  *H01L 21/67* (2006.01)

(56) References Cited

U.S. PATENT DOCUMENTS

| | | | | |
|---|---|---|---|---|
| 4,740,751 | A * | 4/1988 | Misic | G01R 33/34069 324/318 |
| 5,179,264 | A * | 1/1993 | Cuomo | H01J 37/32201 219/121.36 |
| 5,400,002 | A * | 3/1995 | Takahashi | H01P 1/20381 333/204 |
| 5,734,353 | A * | 3/1998 | Van Voorhies | H01Q 11/08 343/742 |
| 6,393,172 | B1 * | 5/2002 | Brinkman | G02F 1/03 359/283 |
| 6,965,099 | B1 * | 11/2005 | Habeger, Jr. | H05B 6/708 219/691 |
| 7,532,789 | B1 * | 5/2009 | Doylend | G02B 6/12007 385/27 |
| 2005/0109879 | A1 * | 5/2005 | Patterson | F03H 99/00 244/53 R |
| 2005/0173382 | A1 * | 8/2005 | Ishii | H01J 37/32192 219/121.43 |
| 2007/0086713 | A1 * | 4/2007 | Ingmar | G02F 1/365 385/122 |
| 2008/0165079 | A1 * | 7/2008 | Smith | B82Y 20/00 343/911 R |
| 2010/0176123 | A1 * | 7/2010 | Mihara | H05B 6/686 219/746 |
| 2010/0315642 | A1 * | 12/2010 | Chow | G01J 3/433 356/432 |
| 2011/0061814 | A1 * | 3/2011 | Ikeda | H01J 37/32192 156/345.41 |
| 2011/0139773 | A1 * | 6/2011 | Fagrell | H05B 6/46 219/702 |
| 2012/0018410 | A1 * | 1/2012 | Zakrzewski | H01P 5/085 219/121.48 |
| 2012/0086334 | A1 * | 4/2012 | DeVincentis | H05B 41/2806 315/40 |
| 2012/0218799 | A1 * | 8/2012 | Furukawa | H02J 17/00 363/126 |
| 2012/0222816 | A1 * | 9/2012 | Ikeda | C23C 16/274 156/345.41 |
| 2013/0062341 | A1 * | 3/2013 | Ashida | H01J 37/32192 219/715 |
| 2013/0120217 | A1 * | 5/2013 | Ueda | H01P 1/203 343/860 |
| 2013/0192760 | A1 * | 8/2013 | Ikeda | H01J 37/32027 156/345.41 |
| 2014/0038431 | A1 * | 2/2014 | Stowell | H01L 21/324 438/795 |
| 2014/0273532 | A1 * | 9/2014 | Nasman | H01L 21/67115 438/795 |
| 2015/0147778 | A1 * | 5/2015 | Pickard | G01N 1/42 435/40.5 |
| 2015/0156828 | A1 * | 6/2015 | Shi | H01R 24/542 219/690 |
| 2015/0214615 | A1 * | 7/2015 | Patel | H01Q 3/36 342/372 |

* cited by examiner

ELECTROMAGNETIC WAVE TREATMENT OF A SUBSTRATE AT MICROWAVE FREQUENCIES USING A WAVE RESONATOR

CROSS-REFERENCE TO RELATED APPLICATIONS

This application is related to and claims priority to U.S. Provisional Application No. 62/222,292, filed Sep. 23, 2015, the entire contents of which are herein incorporated by reference.

FIELD OF THE INVENTION

This invention relates to semiconductor processing technology, and more particularly, to apparatus and methods for controlling properties of a processing system for treating a substrate using an electromagnetic wave.

BACKGROUND OF THE INVENTION

Typically, it is desirable to activate dopants in semiconductors in a manner that does not allow the dopants to diffuse during activation. High temperature annealing technologies have been created with faster dwell times to allow dopant activation with minimal thermal diffusion. Faster dwell times minimize the amount of time that the high temperatures must be sustained to activate the dopants. Examples of conventional high temperature anneals that implement fast dwell times are laser spike annealing, millisecond annealing, and rapid thermal annealing. Even though fast dwell times are used to prevent the dopants from diffusing, the high temperatures required by the conventional high temperature anneals still may exceed 1000 degrees C., and these high temperatures are often times not tolerable even for fast dwell times. To continue Moore's law scaling, devices and device structures are being introduced with reduced thermal tolerances, and thermal budgets are being reduced for semiconductor processing systems. For example, thermal tolerances for some semiconductor substrates during annealing have been reduced to below 400 degrees C.

It is becoming common wisdom to use conventional electromagnetic (EM) wave treatments in thermal annealing and dopant activation processes. Conventional EM wave treatment heats the dopants locally, which then reduces the heat that the substrate as a whole receives. The heating that the substrate is exposed to comes from residual heating which requires reduced temperatures below 500 degrees C. However, conventional EM wave treatment with reduced temperatures below 500 degrees C. still precludes applications that require temperatures to be reduced even further.

Conventional EM wave treatment typically implements surface waves that resonate across the surfaces of the semiconductors at EM wave frequencies where the surface waves are conventional standing waves. Conventional EM wave treatments implementing conventional standing waves are inefficient, non-uniform, and difficult to control, which has the effect of increasing the temperatures of the conventional EM wave treatments rather than lowering the temperatures. Means to implement EM wave treatments of semiconductor surfaces with lower processing temperatures has been implemented by unloading the EM wave in a resistive load. However, the cost of microwave generation is still substantial even with lower processing temperatures. In addition, cooling of the resistive load is an involved process.

There is a need for a system that reduces the cost of microwave generation and eliminates the complexity of the resistive load cooling.

SUMMARY OF THE INVENTION

The present invention provides a processing system for electromagnetic (EM) wave treatment of a substrate, including a process chamber configured to house a substrate for exposure of a surface of the substrate to a travelling EM wave. The processing system also includes an EM wave transmission antenna configured to launch the travelling EM wave into the process chamber for the travelling EM wave to propagate in a direction substantially parallel to the surface of the substrate. The EM wave transmission antenna includes an output end coupled to an input port of the process chamber. The processing system also includes a power coupling system configured to supply EM energy into the EM wave transmission antenna to generate the travelling EM wave at a prescribed output power and in a prescribed EM wave mode. The travelling EM wave is recirculated using a travelling wave circuit comprising a circulator, a process chamber containing the substrate, and a phase shifter.

A method for treating a substrate with electromagnetic (EM) energy is also provided. The method starts with disposing a substrate on a substrate holder in a process chamber. The method further includes launching a travelling EM wave into the process chamber to propagate in a direction substantially parallel to a surface of the substrate. The method further includes exposing the surface of the substrate to the travelling EM wave as the travelling EM wave propagates through the process chamber in the direction substantially parallel to the surface of the substrate. The travelling EM wave is recirculated using a travelling wave circuit comprising a circulator, a process chamber containing the substrate, and a phase shifter.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

Figure 1:
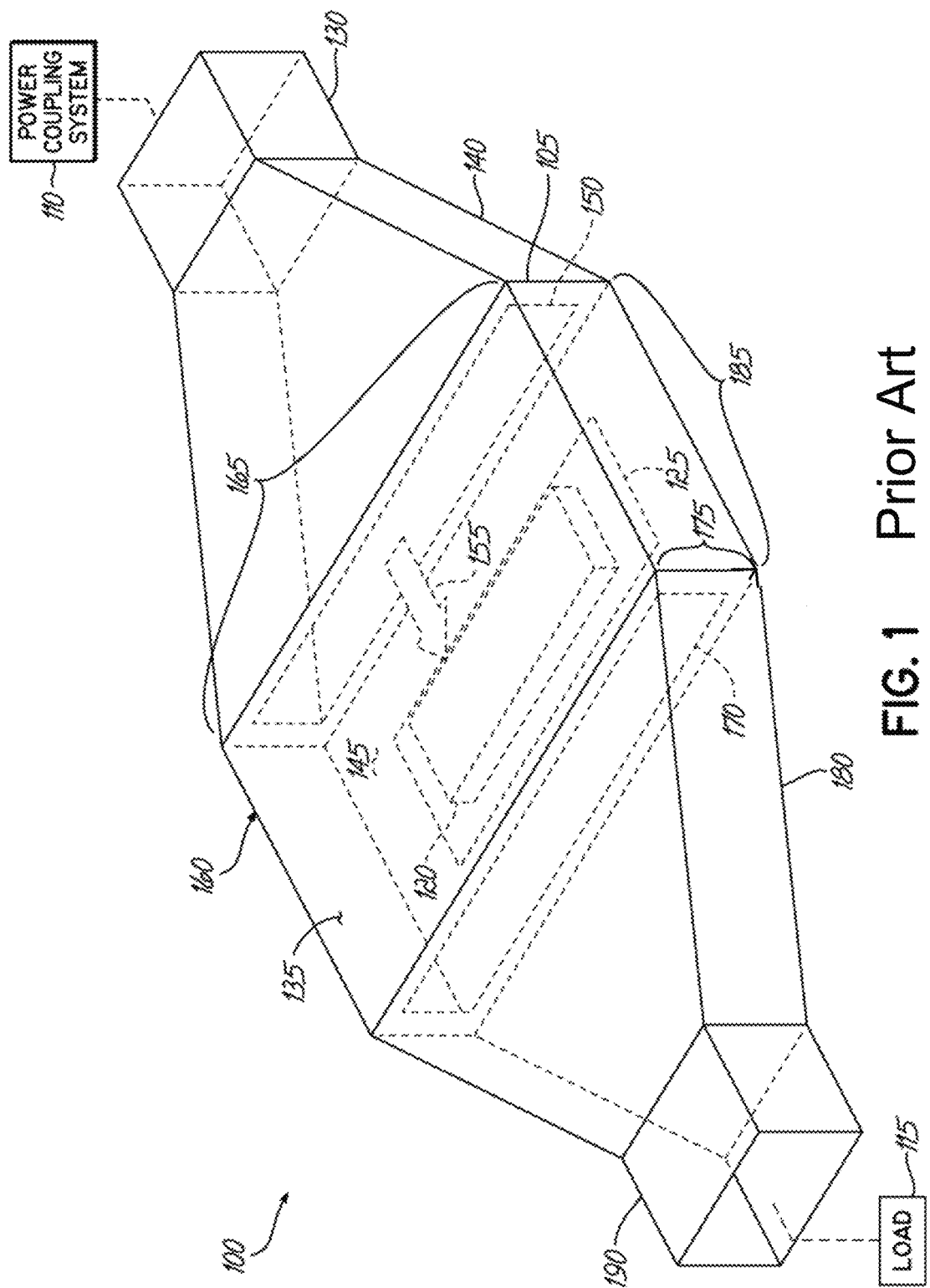
FIG. 1 illustrates an exemplary processing system for prior art EM wave treatment of a substrate.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION

The following Detailed Description refers to accompanying drawings to illustrate exemplary embodiments consistent with the present invention. References in the Detailed Description to "one exemplary embodiment," "an exemplary embodiment," "an example exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to effect such feature, structure, or characteristic in connection with other exemplary embodiments whether or not explicitly described.

The exemplary embodiments described herein are provided for illustrative purposes, and are not limiting. Other exemplary embodiments are possible, and modifications can be made to exemplary embodiments within the scope of the present invention. Therefore, the Detailed Description is not meant to limit the present invention. Rather, the scope of the present invention is defined only in accordance with the following claims and their equivalents.

The following Detailed Description of the exemplary embodiments will so fully reveal the general nature of the present invention that others can, by applying knowledge of those skilled in the relevant art(s), readily modify and/or adapt for various applications such exemplary embodiments, without undue experimentation, without departing from the scope of the present invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

For more efficient electromagnetic (EM) wave treatment of a substrate in a process chamber, the present invention generates EM wave emissions that radiate into the process chamber with travelling EM waves that propagate in a direction substantially parallel to a surface of a substrate housed in the process chamber. The relevant surface of the substrate is the surface to be activated, i.e., the doped surface. The surface is an exposed surface and is opposite the surface that resides on a substrate holder, i.e., the mounted surface. For ease of discussion, this relevant surface to be activated by the EM wave treatment will simply be referred to as the surface of the substrate or substrate surface.

One of ordinary skill in the art will recognize that travelling EM waves are EM waves where each anti-node moves across the surface of the substrate as the travelling EM wave propagates through the process chamber rather than where each non-node remains in the same location of the exposed surface of the substrate as in conventional standing waves. Consequently, travelling EM waves can be controlled to create a relatively even distribution of exposure of the exposed surface of the substrate to the travelling EM waves.

For example, the likelihood that the surface of the substrate is exposed to an even distribution of the travelling EM waves increases as compared to conventional standing waves. The travelling EM waves propagate across the surface of the substrate increasing the overall surface area of the surface of the substrate that is exposed to the non-nodes of the travelling EM waves. As the surface area of the substrate that is exposed to the non-nodes of the travelling EM waves increases, the overall uniformity of the dopant activation for the substrate also increases. The increased overall uniformity of the dopant activation increases the overall effectiveness of the dopant activation for the substrate. Conventional standing waves ensure that only specific locations of the substrate are exposed to the non-nodes of the conventional standing waves while other locations of the substrate surface are not exposed to the non-nodes of the conventional standing waves. Thus, the dopant activation of the substrate surface that is exposed to the conventional standing waves is less uniform and less effective as compared to the substrate that is exposed to the travelling EM waves.

As the following description will show in detail, the disclosed invention takes advantage of this property to increase the overall exposure of the substrate surface to the travelling EM waves as the travelling EM waves propagate across the surface of the substrate. This serves to improve the uniformity of the dopant activation of the substrate surface with minimal thermal diffusion while lowering the temperatures that the substrate and/or the process chamber are exposed to. In the description that follows, even though references may be made to microwave or other enumerated bands of electromagnetic emissions, it should be understood that the system and method apply to a wide variety of desired electromagnetic wave modes (waves of a chosen frequency, amplitude, and phase).

FIG. 1 illustrates an exemplary processing system 100 for prior art EM wave treatment of a substrate. A power coupling system 110 provides input EM energy into an EM wave transmission antenna 130. The EM wave transmission antenna 130 includes a waveguide 140. The EM wave transmission antenna 130 that includes the waveguide 140 may be collectively referred to as an EM wave launcher. When energized, the power coupling system 110 generates EM energy into the EM wave transmission antenna 130 that radiates the EM energy as the travelling EM wave 155 is propagated through the waveguide 140. The output end of the waveguide 140 is coupled to an input port 150 of the process chamber 160. The process chamber 160 includes a planar bottom surface 145 and a planar top surface 135 where the planar top surface 135 opposes the planar bottom surface 145. The sidewall 105 of the process chamber 160 extends between the planar bottom surface 145 of the process chamber 160 and the planar top surface 135 of the process chamber 160.

The process chamber 160 houses a substrate 120 so the substrate 120 can be exposed to the travelling EM wave 155. The substrate 120 is placed on top of a substrate holder 125. The substrate 120 and the substrate holder 125 are located substantially coplanar with the planar bottom surface 145 of the process chamber 160 with a gap between the planar bottom surface 145 and the substrate 120. The travelling EM wave 155 propagates through the process chamber 160 from the EM wave launcher in a direction substantially parallel to the surface of the substrate 120. As the travelling EM wave 155 propagates through the process chamber, the non-nodes of the travelling EM wave 155 activate the dopants of the substrate 120 with minimal thermal diffusion. Process chamber 160 is depicted with a rectangular geometry includes a width 165, a shallow height 175 and/or a depth 185. The geometry maximizes the exposure of the substrate 120 to the travelling EM wave 155, and provides control of the travelling EM wave 155 as the travelling EM wave 155 propagates through the process chamber 160.

As the travelling EM wave 155 propagates through the process chamber 160, an EM wave receiving antenna 190 receives the travelling EM wave 155 and removes the travelling EM wave 155 from the process chamber 160. The EM wave receiving antenna 190 includes a waveguide 180. An input end of the waveguide 180 is coupled to the output port 170 of the process chamber 160. The waveguide 180 receives the travelling EM wave 155 as the travelling EM wave 155 propagates through the process chamber 160.

The EM wave receiving antenna 190 that includes the waveguide 180 and a load 115 may be collectively referred to as an EM absorbing load. The EM absorbing load absorbs the travelling EM wave 155 after the travelling EM wave 155 propagates through the process chamber 160. The load 115 may be coupled to the receiving antenna 190 to absorb the travelling EM wave 155 in a manner that minimizes any reflections generated by the receiving of the travelling EM wave 155 into the receiving antenna 190. The load 115 may include a water-cooled resistor where a resistor is encompassed by water.

Figure 2:
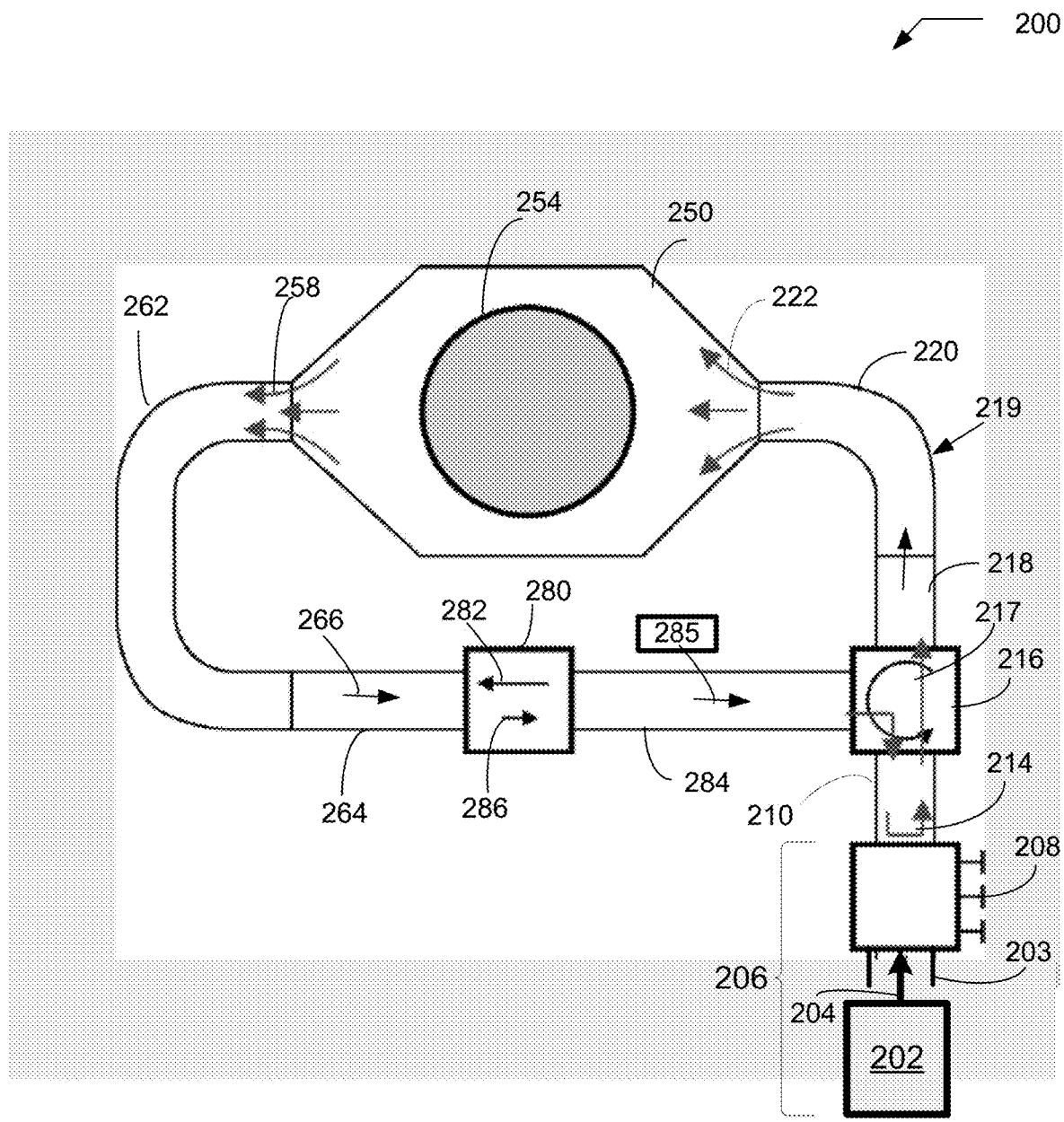
FIG. 2 illustrates an exemplary ring resonator for EM wave treatment of a substrate in an embodiment of the present invention.

FIG. 2 illustrates an exemplary basic ring resonator 200 for EM wave treatment of a substrate in an embodiment of the present invention. The term "basic" is used throughout the description related to FIG. 2 in order to associate a unique name to circuit components of the basic ring resonator 200 which are different from similar components included in subsequent embodiments. The microwave generator 202 generates output EM energy 204 at a prescribed output power and a prescribed wave mode, which is propagated in the basic standing wave circuit 206 comprising a first basic waveguide 203 and a first basic impedance matcher 208. The first basic impedance matcher 208 transmits the EM energy 214 through to the basic traveling wave circuit 219, comprising a basic second waveguide 210, a circulator 216, a third basic waveguide 220, and the processing chamber 250, then radiate back to the circulator 216 utilizing several basic waveguides and a basic phase shifter 280. The first basic impedance matcher 208 is tuned to match the input impedance of the standing wave circuit (waveguide 210) to that of the microwave generator 202 and waveguide 203. When so tuned, the impedance matcher reflects the majority of the wave 214 back into the standing wave circuit. In one embodiment the impedance matcher is tuned so that the EM wave 214 and EM energy is passed through so less than 20% of the EM energy is reflected back to the microwave generator 202.

The basic travelling wave circuit circulator 216 comprises the basic circulator 216, the third basic waveguide 218, the fourth basic waveguide 220, and the processing chamber 250 containing the substrate 254, the fifth basic waveguide 262, the sixth basic waveguide 264, the basic phase shifter 280, and the seventh basic waveguide 284. The basic phase shifter 280 adjusts the EM energy, 282 and 286, by advancing or retarding the wave so that an integer number of wavelengths are maintained in the basic traveling wave circuit 219. People knowledgeable in the art are familiar with the technology involved with waveguides, phase shifters, impedance matchers and circulators in controlling the flow and direction of the initial EM energy 204.

The waveguide configuration requiring more description includes the fourth basic waveguide 220, the fifth basic waveguide 262, the sixth basic waveguide 264, and the basic seventh waveguide 284. The fourth basic waveguide 220 is oriented for the travelling EM wave 217 to exit the circulator 216 proceeds straight and then bend left substantially 90 degrees prior to entering the process chamber 250 in a direction substantially parallel to the surface of the substrate 254. The fifth basic waveguide 262 is oriented for the travelling EM wave 258 to exit straight out of the process chamber 250, to proceed straight then bend left substantially 90 degrees, continue straight, and bend another left substantially 90 degrees prior to entering into the sixth basic waveguide 264. The sixth basic waveguide 264 is oriented for the travelling EM wave 266 to proceed straight and enter the phase shifter 280 whereas the seventh basic waveguide 284 is oriented for the travelling EM wave 285 to exit the phase shifter 262, proceed straight and enter the circulator 216.

The initial output EM energy 204 is generated as a traveling wave EM energy 202 with a microwave frequency in a range of 1 GHz to 10 GHz, in a range of 2 to 8 GHz or in a range from 0.10 to 0.99 GHz. The temperature of a surface of the substrate 254 can be at or below 400 degrees C. or at below 350 degrees C. Through constructive interference, the standing wave 214 can be changed to a traveling wave. As a travelling wave, the EM energy 222 is more efficient in a dopant activation or thermal annealing of the substrate 254 surface compared to when the substrate is exposed to a conventional standing wave.

The difference between the energy flow in connection with prior art EM energy flow shown in FIG. 1 versus the basic ring resonator 200 described here in FIG. 2 is the EM energy 204 is recirculated in the basic traveling wave circuit 219 whereas the travelling EM wave 155 in FIG. 1 is dumped into a cooled resistive load 115. Recirculation of the EM energy 204, FIG. 2, results in reduced cost for the microwave generation and elimination of complex system for cooling the resistive load required in prior art, such as the resistive load 115 in FIG. 1.

Figure 3:
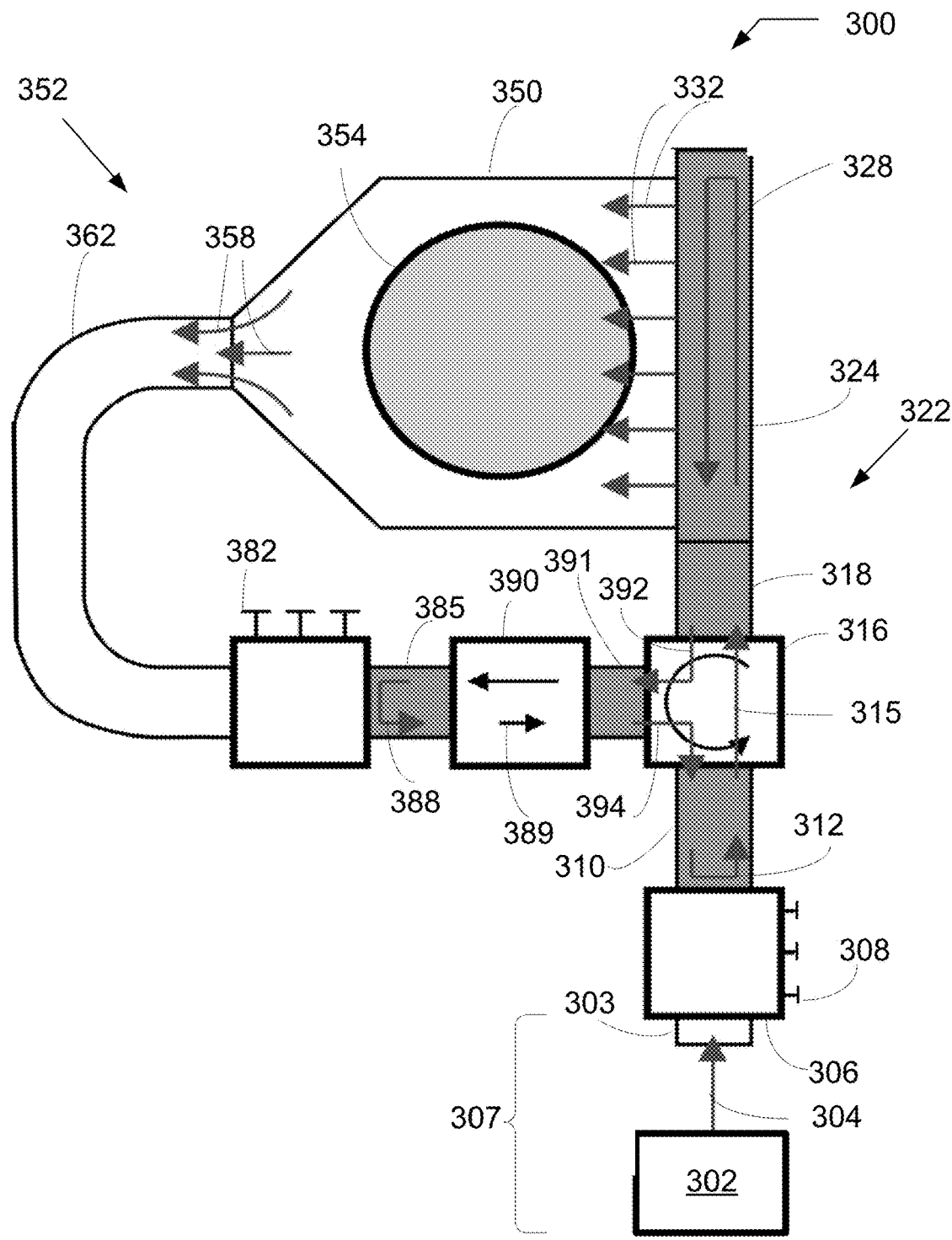
FIG. 3 illustrates an exemplary standing wave resonator coupled to a loop-back travelling wave circuit in an embodiment of the present invention.

FIG. 3 illustrates an exemplary schematic 300 of an EM wave processing system comprising a) an EM energy generation circuit 307, b) a standing wave resonator (SWR) 322, and c) a loop-back travelling wave circuit (TWC) 352 in an embodiment of the present invention. The EM generation circuit 307 is coupled to the SWR 322, the SWR 322 is also coupled to the loop-back TWC 352, and the loop back TWC 352 is coupled to SWR 322. The EM energy generation circuit 307 comprises the EM generator 302 which generates an output EM energy 304 and transmits the EM energy 304 through a first waveguide 303 and an impedance circuit 306 with a first impedance matcher 308, the EM energy 304 becoming an EM energy 312 that is input into the circulator 316. The first impedance matcher 308 ensures a one way transmission of the EM energy 304 so that none of the EM energy is transmitted back to the EM energy generator 302.

The standing wave resonator (SWR) 322, shaded segments of FIG. 3, comprises three arms joined at the circulator 316. The EM energy in the SWR 322 in the three arms and in the circulator 316 is a standing wave. The first arm of the SWR includes the first impedance matcher 308 and the second waveguide 310 where the EM energy 312 is directed into the circulator 316. The second arm of the SWR comprises the third waveguide 318 and the slot wave antenna (SWA) 324.

The third arm of the SWR includes the waveguide 385, the first phase shifter 390, and the fourth waveguide 391. The EM energy 388 is recycled in the fifth waveguide 385 and is transmitted through the first phase shifter 390 as EM energy 389, proceeding through the fourth waveguide 391 as EM energy 394 into the circulator 316.

Referring to the standing wave resonator 322, the EM energy 315 coming out of the circulator 316 is transmitted through the third waveguide 318 and proceeds through the slot wave antenna (SWA) 324 where the EM energy 328 is propagated and projected as output EM energy 332 directed towards the process chamber 350 containing the substrate 354. The EM energy 315 is converted by the circulator 316 into a standing wave 328 through constructive interference. The EM energy 332 is propagated inside the process chamber 350 at an angle substantially parallel to the surface of the substrate 354.

Part of the EM energy 328 in the slot wave antenna is transmitted through the circulator 316 and propagates as EM energy 392 in the first phase shifter 390 and becomes the EM energy 388 recycled in the sixth waveguide 385 prior to the second impedance matcher 382. The EM energy 388 is processed by the first phase shifter 390 and proceeds through the waveguide 391 and into the circulator 316 as EM energy 394. The circulator 316 transmits the EM energy 394, recycles the wave as EM energy 312 in second waveguide 310, directs the EM energy 312 back to the circulator 316, and start the cycle over as EM energy 315.

The other part of the EM wave processing system is the loop-back TWC 352 which comprises the process chamber 350, the substrate 354, a fifth waveguide 362, and an impedance circuit 386 with a second impedance matcher 382. Travelling EM waves 332 are propagated in the process chamber 350 at an angle substantially parallel to the surface of the wafer 354. The substrate 354 can contain a layer that requires a thermal annealing process or a dopant activation process. The travelling EM wave energy 332 can be at a microwave frequency in a range of 1 GHz to 10 GHz or in a range from 0.10 to 0.99 GHz. The temperature of a surface of the substrate 354 can be at or below 400 degrees C., at or below 360 degrees C., or at below 340 degrees C.

Figure 4:
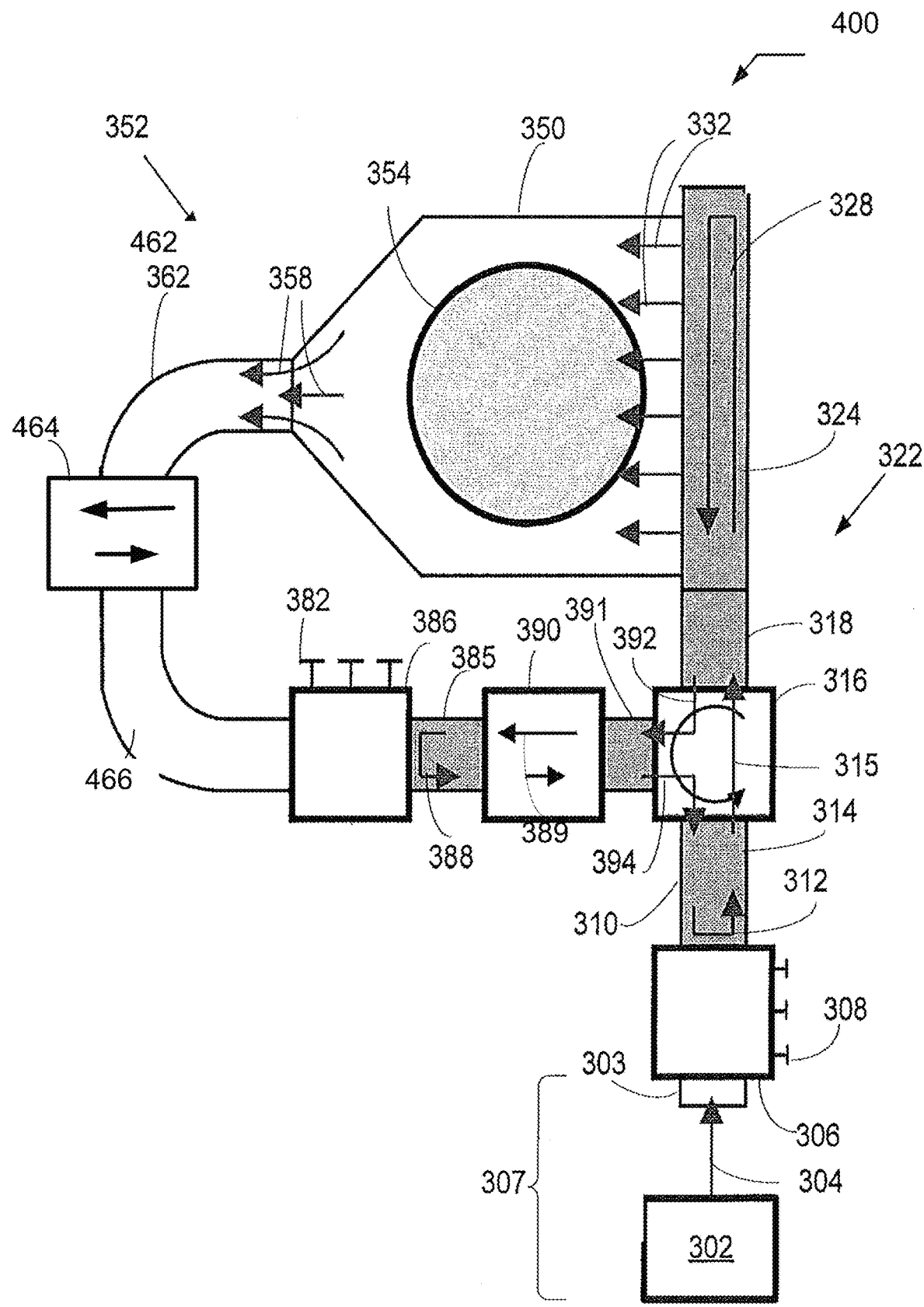
FIG. 4 illustrates another exemplary standing wave resonator coupled to a loop-back travelling wave circuit in another embodiment of the present invention.

FIG. 4 illustrates another exemplary schematic 400 of a system including a standing wave resonator coupled to a loop-back travelling wave circuit in another embodiment of the present invention. Note that FIG. 4 system elements that have the same element number present in FIG. 3 have the same function and purpose; as such, the description of those similar elements shall not be repeated here. There are three new system elements in FIG. 4. The new elements in FIG. 4 include a second phase shifter 464 and the waveguide 362/462 where the EM energy 358 starts from the process chamber 350 proceeds to a left 90-degree turn and ends up in the second phase shifter 464. The last new element is waveguide 466 that starts from the second phase shifter 464, proceeds to a left 90-degree turn and ends up in the second impedance matcher 382. Similar in function to the first phase shifter 390, the second phase shifter 464 is configured to insure a whole number of wavelengths exist in the loop-back travelling wave circuit 352. The presence of the first and second phase shifters ensure tighter control on the number of integer wavelengths in order to keep the number consistent throughout the loop-back TWC circuit 352 and the standing wave circuit 322.

Figure 5A:
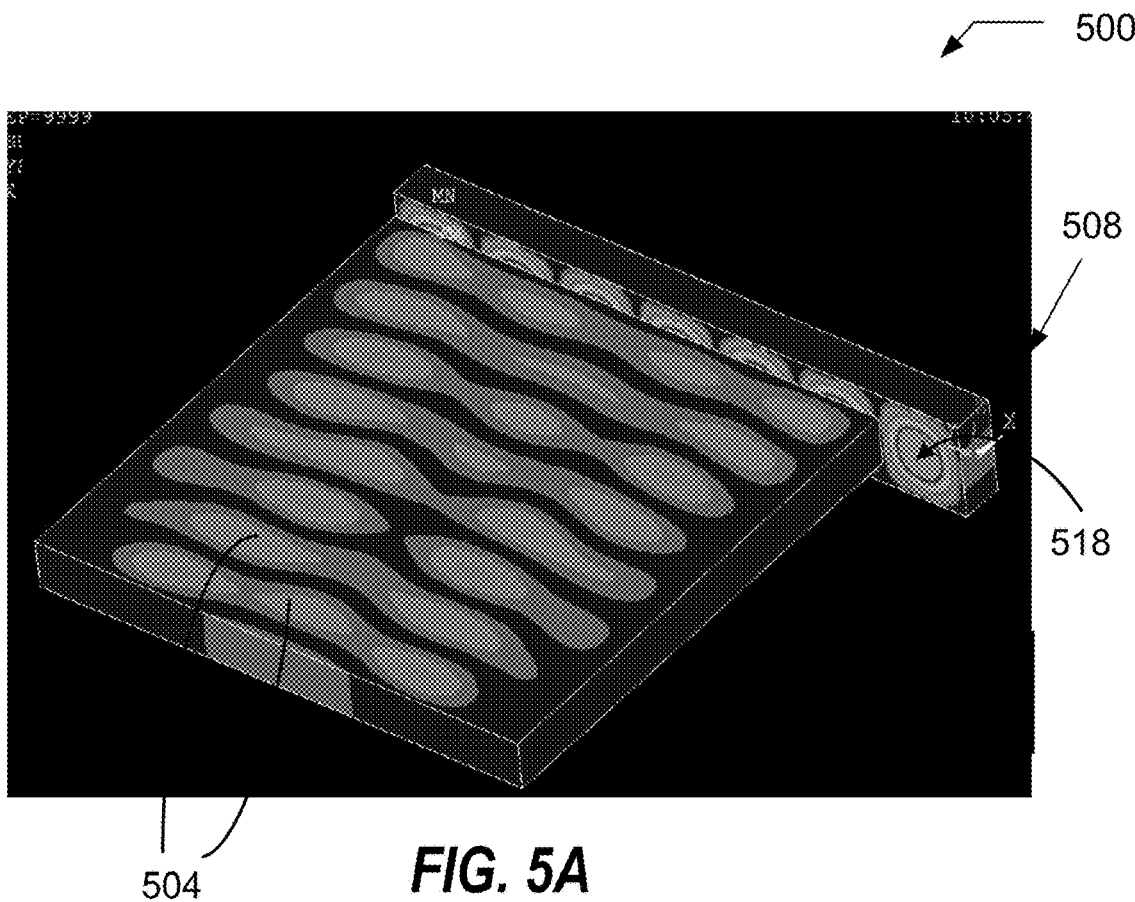
FIG. 5A illustrates exemplary images of travelling waves propagated through a slot-wave antenna (SWA) in an embodiment of the present invention.

FIG. 5A illustrates exemplary image 500 of standing waves generated by a slot-wave antenna (SWA) 508, 324 in FIG. 3 and FIG. 4, in an embodiment of the present invention. The travelling EM wave enters the entry port 518 of the SWA 508 and propagates the travelling waves 504 into the process chamber.

Figure 5B:
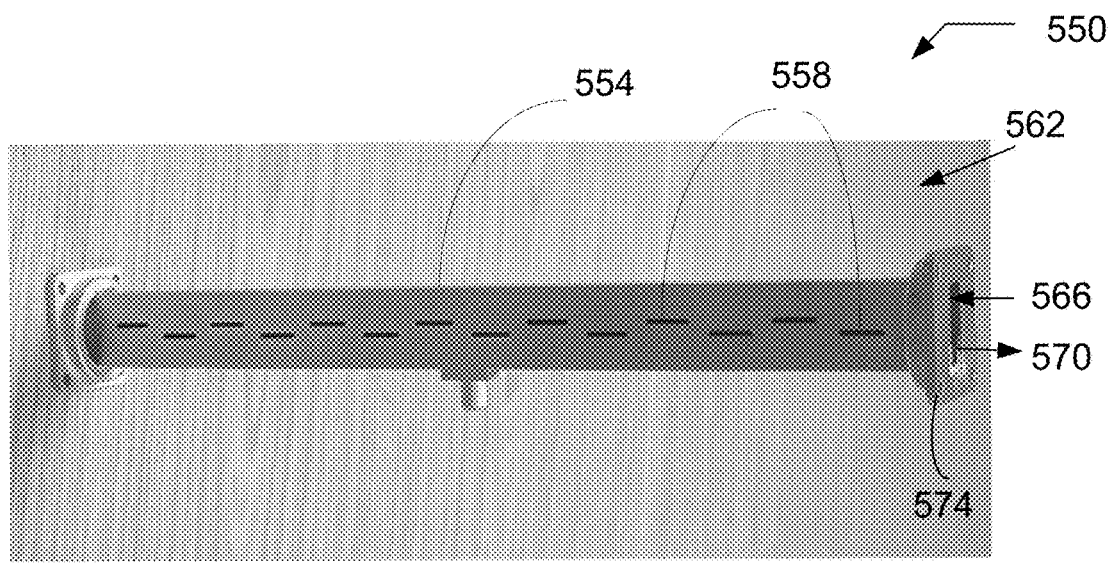
FIG. 5B is illustrates an exemplary image of a slot-wave antenna device.

FIG. 5B illustrates an exemplary image 550 of a slot-wave antenna device 562. The EM energy 566 enters through entry port 574 and proceeds through the arm 554 of the SWA 562 and directs a part of the EM energy out through the slots 558. The rest of the EM energy 566 cycles back through the arm 554 and comes out of the SWA port as EM energy 570 and returns to the standing wave resonator 322 of FIG. 3 and FIG. 4.

Figure 6:
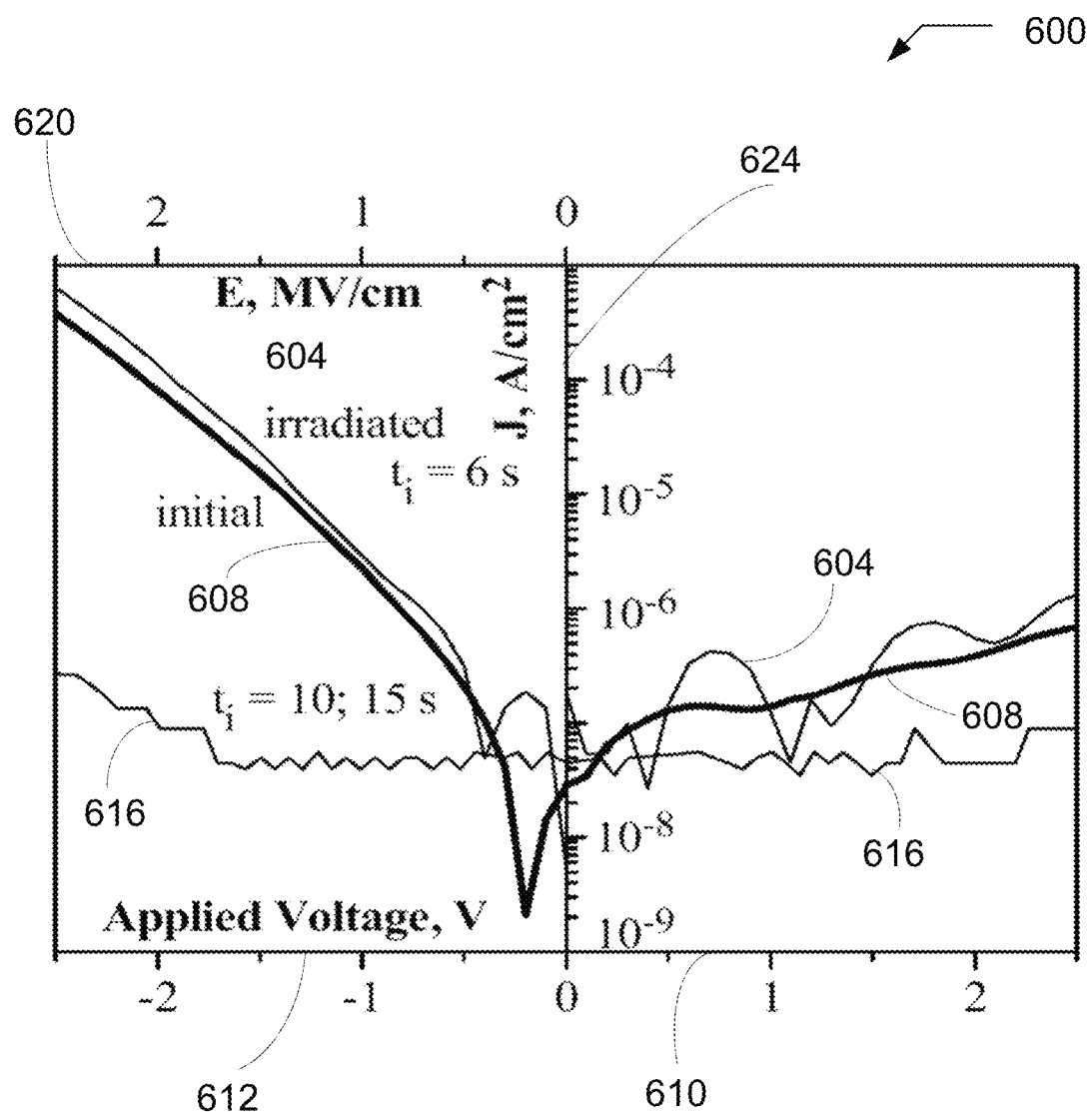
FIG. 6 illustrates an exemplary graph of leakage reduction after a 6 to 15 seconds microwave treatment of a substrate from "High-k HfTaO stacks in response to microwave irradiation", by E. Atanassova and D. Spassov, Journal of Physics: Conference Series December 2010; 253(1) 012038, DOI: 10.1088/1742-6596/253/1/012038.

FIG. 6 illustrates an exemplary graph 600 of leakage reduction after a 6 to 15 seconds microwave treatment of a substrate from "High-k HfTaO stacks in response to microwave irradiation", by E. Atanassova and D. Spassov, Journal of Physics: Conference Series December 2010; 253(1) 012038, DOI: 10.1088/1742-6596/253/1/012038. The Y-axis 624 in the center of the graph 600 is the leakage amount J measured in Angstroms per square centimeter, A/cm2. The X-axis on the top 620 is the energy E measured in MV/cm and the X-axis on the bottom is applied voltage, V, ranging from 0 to +2 on the right side 610 and 0 to −2 on the left side 612. The initial curve 608 prior to the irradiation shows a loop-sided V shape curve of energy leakage. Leakage after 6 second of microwave treatment is shown by a curve 604 close to the initial curve 608. Leakage after 15 seconds of microwave treatment is shown by a curve 616 which shows lower leakage of the energy E.

Figure 7A:
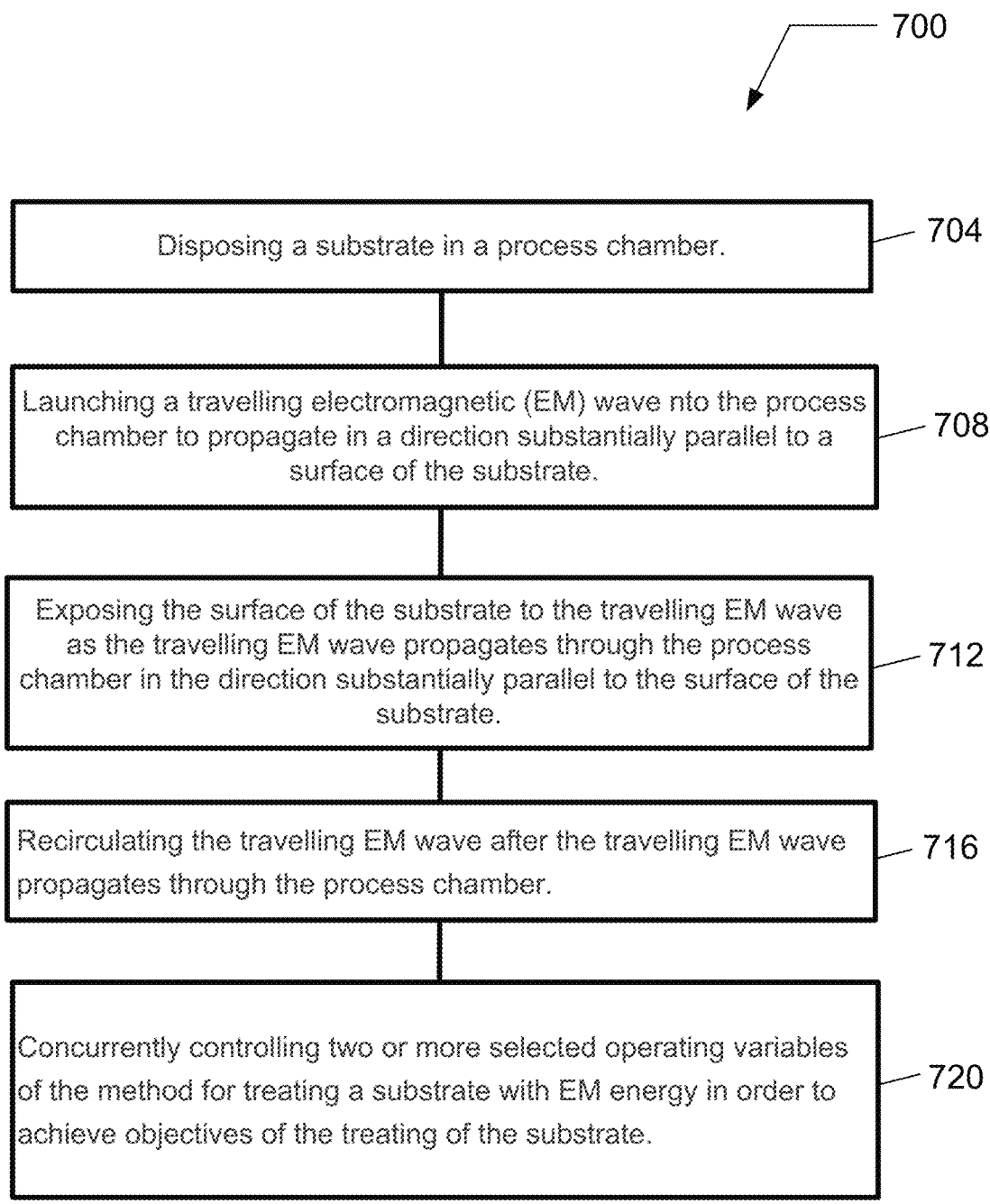
FIG. 7A illustrates an exemplary flowchart of the method steps or operations of an embodiment of the present invention.

FIG. 7A illustrates an exemplary flowchart 700 of the method steps or operations of an embodiment of the present invention. In operation 704, a substrate that will undergo a thermal annealing or dopant activation is disposed in the process chamber. In operation 708 a travelling electromagnetic (EM) wave is launched into the process chamber to propagate in a direction substantially parallel to a surface of the substrate. In operation 712, the surface of the substrate is exposed to the travelling EM wave as the travelling EM wave propagates through the process chamber in the direction substantially parallel to the surface of the substrate. In operation 716, the travelling EM wave is recirculated after the travelling EM wave propagates through the process chamber. In operation 720, two or more selected operating variables of the method for treating a substrate with EM energy are concurrently controlled in order to achieve objectives of the treating of the substrate. The objectives of the EM wave treatment can include reduction of the leakage of energy in the microwave annealing or dopant activation, target cost of ownership, throughput of substrates per hour and the like.

Figure 7B:
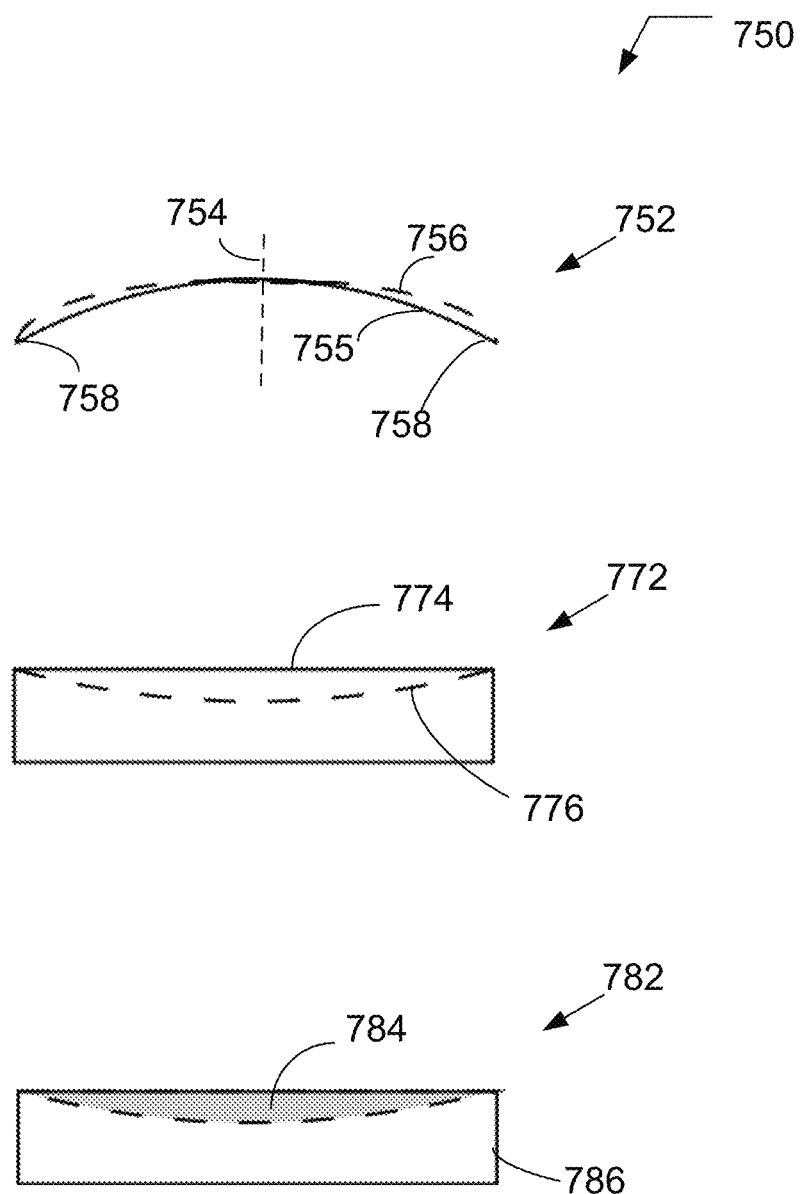
FIG. 7B illustrates an exemplary schematic diagram of techniques used in improving the uniformity of the dopant annealing process.

FIG. 7B illustrates an exemplary schematic diagram 750 of techniques used in improving the uniformity of the dopant annealing process. In general, the traveling wave amplitude 752 is expected to be largest along the process chamber center-line 754, decreasing to zero at the edges 758. The expected first wave amplitude, (solid line 755) and second wave amplitude, (dashed line 756), have some variances where the first wave amplitude applies to a first chamber portion and the second wave amplitude applies to the second chamber portion of a two-chamber process chamber. This variance leads to non-uniformity of the dopant anneal across the substrate.

Uniformity of the dopant anneal can be improved through 1) varying the substrate rotation, 2) shaping of the process chamber profile, and 3) adding dielectric lenses to the process chamber. The behavior of the wave profile and consequently, uniformity of dopant anneal can be determined by using test data to correlate wave profile characteristics with rotation per minute (RPM) of the substrate. The center FIG. 772 shows a process chamber with a rectangular (solid line 774) and convex profile (dashed line 776). The bottom FIG. 782 shows a process chamber 786 with a dielectric lens 784. The field profile 782 with the dielectric lens 784 is the same as the profile for a shaped chamber, such as that shown in the center FIG. 772. The lens 784 can be made of a material with a high dielectric constant, such as Si or quartz. Silicon lenses are preferred.

Figure 8:
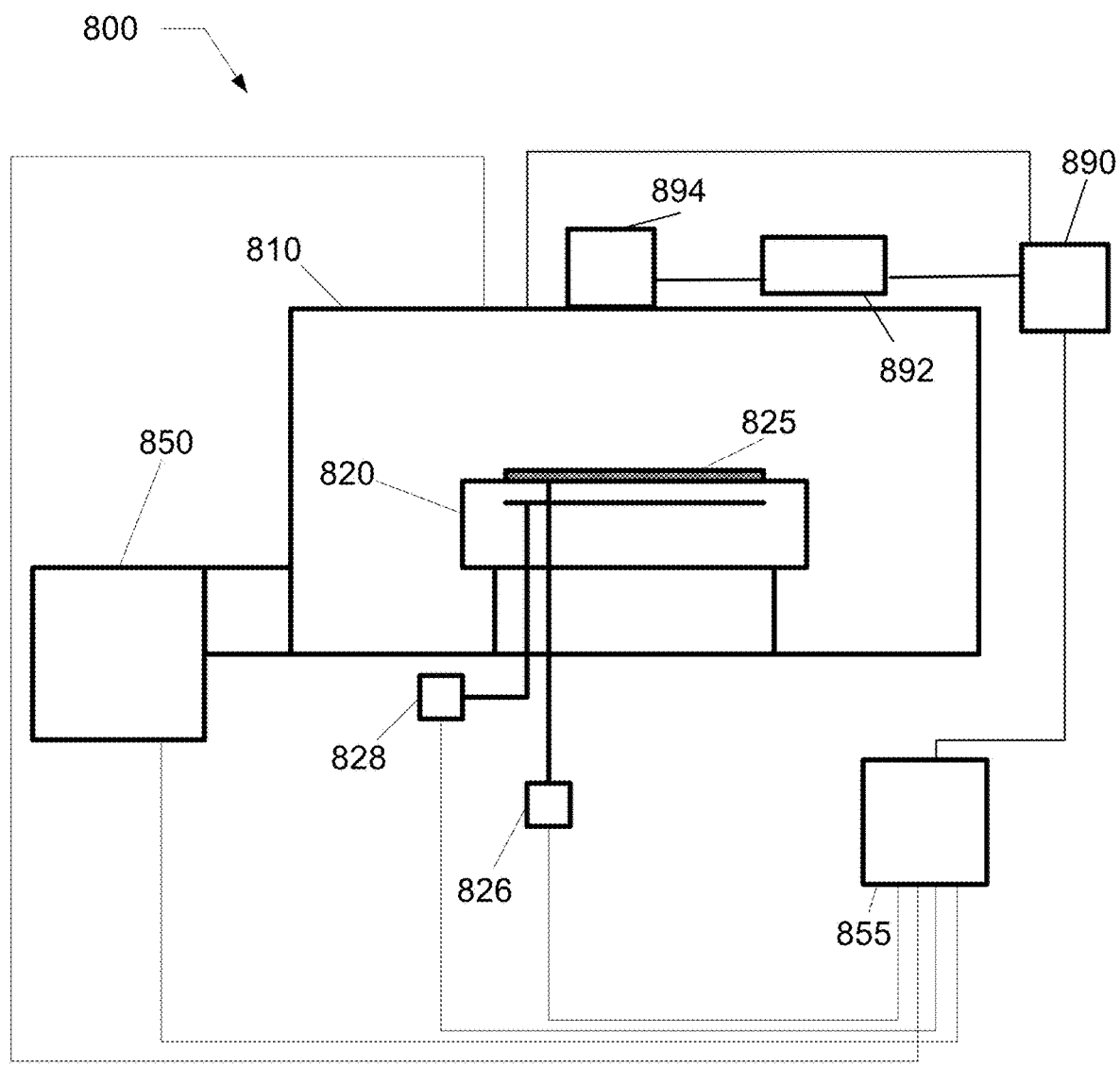
FIG. 8 illustrates an exemplary schematic diagram of a processing system for EM wave treatment of a substrate in an embodiment of the present invention.

FIG. 8 illustrates an exemplary schematic diagram 800 of a processing system for EM wave treatment of a substrate in an embodiment of the present invention. The EM processing system can also be used for plasma and/or etch processing. An EM treatment system 800 configured to perform the above identified processes as discussed in relation to FIG. 2, FIG. 3, FIG. 4, FIG. 7A, and FIG. 7B, is depicted in FIG. 8 comprising a processing chamber 810, substrate holder 820, upon which a substrate 825 to be processed is affixed, and vacuum pumping system 850. Substrate 825 can be a semiconductor substrate, a wafer, a flat panel display, or a liquid crystal display with a layer which require thermal annealing and dopant activation processes.

Substrate 825 can be affixed to the substrate holder 820 via a clamping system 828, such as a mechanical clamping system or an electrical clamping system (e.g., an electrostatic clamping system). Furthermore, substrate holder 820 can include a heating system (not shown) or a cooling system (not shown) that is configured to adjust and/or control the temperature of substrate holder 820 and substrate 825. The heating system or cooling system may comprise a re-circulating flow of heat transfer fluid that receives heat from substrate holder 820 and transfers heat to a heat exchanger system (not shown) when cooling, or transfers heat from the heat exchanger system to substrate holder 820 when heating. In other embodiments, heating/cooling elements, such as resistive heating elements, or thermo-electric heaters/coolers can be included in the substrate holder 820, as well as the chamber wall of the processing chamber 810 and any other component within the processing system 800. In embodiments of the invention, the substrate 825 may be heated/cooled to be at or below 400 degrees C. In another embodiment, the substrate 825 may be heated/cooled to be at or below 360 degrees C. In still another embodiment, the substrate 825 may be heated/cooled to be at or below 340 degrees C.

Additionally, a heat transfer gas can be delivered to the backside of substrate 825 via a backside gas supply system 826 in order to improve the gas-gap thermal conductance between substrate 825 and substrate holder 820. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 825.

A microwave generator 894 connected to a microwave power source 892 which in turn is coupled to the power coupling system 890 can be utilized to generate the EM energy used in the EM wave treatment of the substrate 825 for thermal annealing process or dopant activation process using the system and method of the present invention.

Vacuum pumping system 850 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 810.

As mentioned above, the controller 855 can comprise a microprocessor, memory, and a digital I/O port capable of generating control voltages sufficient to communicate and activate inputs to EM treatment system 800 as well as monitor outputs from EM treatment system 800. Moreover, controller 855 can be coupled to and can exchange information with vacuum pumping system 850, as well as the substrate heating/cooling system (not shown), the backside gas supply system 826, power coupling system 890, microwave power source 892 coupled to the power coupling system 890, and/or the electrostatic clamping system 828. For example, a program stored in the memory can be utilized to activate the inputs to the aforementioned components of EM treatment system 800 according to a process recipe in order to perform a EM treatment process on substrate 825.

Depending on the applications, additional devices such as sensors or metrology devices can be coupled to the EM treatment chamber 810 and to the controller 855 to collect real time data cost of ownership, reduction of energy leakage in annealing and doping processes, and the like are achieved.

It is to be appreciated that the Detailed Description section, and not the Abstract section, is intended to be used to interpret the claims. The Abstract section can set forth one or more, but not all exemplary embodiments, of the present invention, and thus, are not intended to limit the present invention and the appended claims in any way.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A processing system for electromagnetic (EM) wave treatment of a substrate, comprising:
   an EM wave generation circuit including an EM wave generator configured to generate an EM wave at a prescribed output power and a prescribed wave mode, and a first waveguide coupled with the EM wave generator;
   a standing wave circuit (SWC) coupled to the EM wave generation circuit and configured to reflect back or allow an EM wave to pass through, the standing wave circuit including an impedance matcher coupled to the first waveguide and configured to allow an EM wave proceeding in one direction from the EM wave generator and from the first waveguide to pass through and to reflect back an EM wave proceeding in another direction opposite the one direction;
a travelling wave circuit (TWC) coupled to the standing wave circuit and including:
a circulator configured to redirect a flow of the travelling EM wave and generate a travelling EM wave, the circulator coupled with the standing wave circuit;
a process chamber coupled with the circulator to receive the traveling EM wave and configured to house a substrate for exposure of a surface of the substrate to the travelling EM wave;
a waveguide configuration for directing the traveling EM wave into and out of the process chamber and back through the circulator;
a phase shifter coupled within the waveguide configuration and configured and positioned to affect the traveling EM wave and maintain an integer number of wavelengths in the traveling wave circuit;
the standing wave circuit configured for reflecting back an EM wave from the circulator in the traveling wave circuit that is directed toward the standing wave circuit;
wherein the travelling EM wave is recirculated through the travelling wave circuit (TWC) and the process chamber thereby reducing the power usage and eliminating the need for a resistive load device to unload the travelling EM wave.

2. The processing system of claim 1, wherein the EM wave generator is configured to generate the EM wave at a microwave frequency in a range of 1 GHz to 10 GHz or in a range from 0.10 to 0.99 GHz.

3. The processing system of claim 1, wherein the substrate surface is at or below 400 degrees C.

4. The processing system of claim 1, wherein the travelling wave circuit further comprises:
a waveguide configuration that includes a fourth waveguide, a fifth waveguide, a sixth waveguide, and a seventh waveguide;
wherein the fourth waveguide is oriented for the travelling EM wave to exit the circulator and bend left substantially 90 degrees prior to entering the process chamber in a direction substantially parallel to the surface of the substrate,
wherein the fifth waveguide is oriented for the travelling EM wave exit straight out of the process chamber, to proceed straight then bend left substantially 90 degrees, continue straight, and bend another left substantially 90 degrees prior to entering into the sixth waveguide;
wherein the sixth waveguide is oriented for the travelling EM wave to proceed straight and enter the phase shifter; and
wherein the seventh waveguide is oriented for the travelling EM wave to exit the phase shifter, proceed straight and enter circulator.

5. The processing system of claim 1, wherein:
the impedance matcher is tuned such that the EM wave and EM energy thereof is passed through so that less than 20% of the EM energy is reflected back to the EM wave generator.

6. The processing system of claim 1 wherein the standing wave circuit and travelling wave circuit functions as a ring resonator to recirculate the EM energy over the substrate in order to reduce costs of ownership of the EM wave generator.

7. The processing system of claim 1 further comprising a plurality of operating systems including a power coupling system, a vacuum system, an electrostatic clamping system, a gas supply system, a controller coupled to the process chamber, the controller configured to control at least one of the operating systems of the processing system in order to meet EM treatment objectives.

8. A processing system for electromagnetic (EM) wave treatment of a substrate, the processing system comprising:
an EM wave generation circuit including an EM wave generator configured to generate an EM wave at a prescribed output power and a prescribed wave mode, and a first waveguide coupled with the EM wave generator;
a standing wave circuit coupled to the EM wave generation circuit and configured to reflect back or allow an EM wave to pass through, the standing wave circuit including a first impedance matcher coupled to the EM wave generation circuit and configured to allow an EM wave proceeding in one direction from the EM wave generation circuit to pass through and to reflect back an EM wave proceeding in another direction opposite the one direction;
a standing wave resonator coupled to the standing wave circuit, the standing wave resonator configured to generate a travelling EM wave and recirculate the travelling EM wave, the standing wave resonator including:
a circulator configured to redirect a flow of the travelling EM wave, the circulator coupled with the standing wave circuit;
a slot wave antenna coupled with the circulator and configured to propagate a travelling EM wave; and
a first phase shifter coupled with the circulator and configured to affect the traveling EM wave and maintain an integer number of wavelengths in the standing wave resonator;
the standing wave circuit configured for reflecting back an EM wave from the circulator in the traveling wave circuit that is directed toward the standing wave circuit; and
a loop-back travelling wave circuit coupled to the standing wave resonator and including:
a process chamber coupled to the slot wave antenna to receive the traveling EM wave and configured to house a substrate for exposure of a surface of the substrate to the travelling EM wave;
a waveguide configuration for directing the traveling EM wave out of the process chamber and back through the standing wave resonator;
a second impedance matcher coupled with the waveguide configuration and configured to reflect back or allow an EM wave to pass through;
a second phase shifter coupled with the waveguide configuration and configured to affect the traveling EM wave and maintain an integer number of wavelengths exist in the loop-back travelling wave circuit;
wherein the travelling EM wave is transmitted through the standing wave circuit and into the standing wave resonator and wherein the travelling EM wave propagates in a direction substantially parallel to a surface of the substrate.

9. The processing system of claim 8, wherein the EM wave generator is configured to generate the EM wave at a microwave frequency in a range of 1 GHz to 10 GHz or in a range from 0.10 to 0.99 GHz.

10. The processing system of claim 8, the standing wave circuit further comprising:

a second waveguide coupled to the first impedance matcher and the circulator.

11. The processing system of claim 8, wherein:
the first impedance matcher is tuned such that the EM wave and EM energy thereof is passed through so that less than 20% of the EM energy is reflected back to the EM generator.

12. The processing system of claim 8, wherein the travelling wave circuit, the standing wave resonator, and the loop-back travelling wave circuit function as a resonator to recirculate the EM energy over the substrate in order to reduce costs of the EM wave generator.

13. The processing system of claim 8, wherein the substrate surface is at or below 400 degrees.

14. The processing system of claim 8, wherein the standing wave resonator and loop-back travelling wave circuit recirculate the EM energy in order to reduce costs of ownership of the EM wave generator.

\* \* \* \* \*